United States Patent [19]
Jung et al.

[11] Patent Number: 6,150,069
[45] Date of Patent: Nov. 21, 2000

[54] OXABICYCLO COMPOUND, A POLYMER-CONTAINING SAID COMPOUND, AND A PHOTORESIST MICRO PATTERN FORMING METHOD USING THE SAME

[75] Inventors: Jae Chang Jung; Chi Hyeong Roh; Min Ho Jung; Geun Su Lee; Ki Ho Baik, all of Kyoungki-do, Rep. of Korea

[73] Assignee: Hyundai Electronics Industries Co., Ltd., Rep. of Korea

[21] Appl. No.: 09/311,488

[22] Filed: May 13, 1999

[30] Foreign Application Priority Data

May 13, 1998 [KR] Rep. of Korea ...................... 98-17211

[51] Int. Cl.$^7$ ...................................... G03F 7/004
[52] U.S. Cl. ...................... 430/270.1; 430/325; 430/326; 526/268; 526/271; 526/281
[58] Field of Search .................................... 526/268, 271, 526/281; 430/270.1, 325, 326

[56] References Cited

U.S. PATENT DOCUMENTS 4,440,850  4/1984  Paul et al. .

*Primary Examiner*—Janet Baxter
*Assistant Examiner*—Rosemary Ashton
*Attorney, Agent, or Firm*—Townsend and Townsend and Crew LLP

[57] ABSTRACT

The present invention relates to oxabicyclo compounds and a method of preparing the same. The compounds of the present invention can be used as monomers for preparing a photoresist resin which is useful in photolithography processes using ultra-violet light sources, and are represented by the following Formula 1:

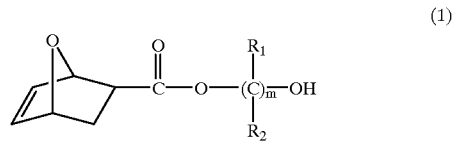

(1)

wherein, $R_1$ and $R_2$ are the same or different, and represent a hydrogen or a $C_1$–$C_4$ straight or branched chain substituted alkyl group; and m is a number from 1 to 4.

In other embodiments, the present invention relates to an ArF or a KrF photoresist resin containing an oxabicyclo monomer, and compositions and photoresist micro pattern forming methods using the same.

18 Claims, 9 Drawing Sheets

OXABICYCLO COMPOUND, A POLYMER-CONTAINING SAID COMPOUND, AND A PHOTORESIST MICRO PATTERN FORMING METHOD USING THE SAME

BACKGROUND OF THE INVENTION

The present invention generally relates to an oxabicyclo monomer and a photoresist polymer formed therefrom, a photoresist composition containing said polymer, and a method of forming a photoresist micro pattern using the polymer. During the manufacture of a micro circuit of a highly integrated semiconductor device, the polymer of the present invention can be used as a photoresist in a photoresist lithography process using a KrF(248 nm) or an ArF (193 nm) light source. These are the light sources usually applied in the manufacture of 1 G and 4 G Dynamic Random Access Memory ("DRAM") semiconductor devices.

In general, an ArF photoresist usually requires excellent etching resistance and adhesiveness as well as low light absorbance at 193 nm wavelength. The ArF photoresist should also be developable by using a 2.38 wt % aqueous tetramethylammonium hydroxide (TMAH) solution. Up to now, many researchers have focused on photoresist resins having an etching resistance and transparency to 193 nm wavelength similar to that of novolac-type resins. This work is described, for example, in the following articles: "Synthesis and Dissolution Characteristics of Novel Alicyclic Polymers With Monoacid Ester Structures" (Takashi Hattori et al., *Journal of Photopolymer Science and Technology*, 1997, Vol. 10, No. 4, pp. 535–544.), "New Protective Groups in Alicyclic Methacrylate Polymers for 193 nm Resists" (Ibid., pp. 545–550), and "Chemically Amplified Resist Based on High Etch-Resistant Polymers for 193 nm Lithography" (Ibid., pp. 561–570) and so on. To obtain an etching resistance similar to that of a novolac-type resin, an ArF photoresist resin should contain an alicyclic group. However, alicyclic-type resins generally have poor adhesiveness. A micro pattern using an alicyclic-type resin is illustrated in FIG. 1. The alicyclic-type resin used to form the pattern in FIG. 1 has good resolution, but poor adhesiveness. Thus, a pattern collapse occurs such as that shown in FIG. 1. As a result, it is very difficult to practically apply such a resist to a semiconductor device.

The photosensitive properties of the photoresist resin are affected by the monomer type used to form the photoresist resin. Thus, photosensitivity, etching resistance, adhesiveness, resolution, and so on varies depending on the monomer type introduced into the photoresist resin. In addition, the monomers conventionally used to form the photoresist resin are expensive, thus making it difficult to mass-produce the photoresist resin using conventional monomers. Therefore, the invention of a monomer which would allow the mass-production of a photoresist resin having excellent photosensitive properties, is advantageous.

SUMMARY OF THE INVENTION

In accordance with the present invention, it has been found that when an oxabicyclo compound, which contains an alicyclic group, is used as a monomer to form an ArF or a KrF photoresist resin polymer, the etching resistance is excellent, the pattern collapse of FIG. 1 can be prevented because of the excellent adhesiveness of the photoresist, and the photoresist resin can be mass-produced economically because the monomer is inexpensive.

Oxabicyclo compounds of the present invention are represented by the following Formula 1:

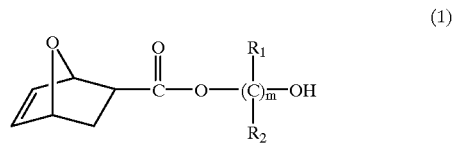

(1)

wherein, $R_1$ and $R_2$ are the same or different, and represent hydrogen or a $C_1$–$C_4$ straight or branched chain substituted alkyl group; and m is a number from 1 to 4. The present invention also relates to a method of preparing the above oxabicylco compound.

Polymers of the present invention, into which the oxabicyclo compound of the above Formula 1 is introduced as a monomer, are represented by the following Formula 2:

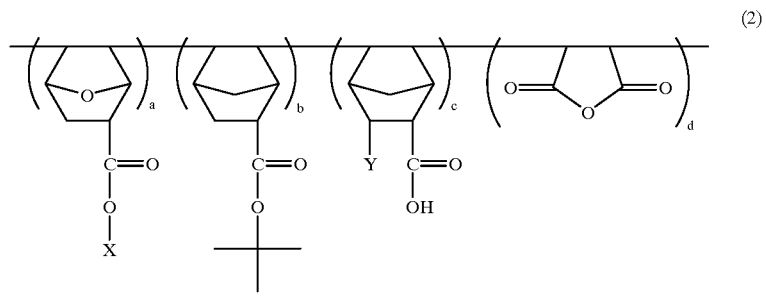

(2)

wherein, X is 2-hydroxy ethyl, 2-hydroxy propyl, 3-hydroxy propyl, 2-hydroxy butyl, 3-hydroxy butyl, 4-hydroxy butyl, or 2-methyl-3-hydroxy propyl; Y is a hydrogen or a carboxylic acid group; and the ratio of a:b:c:d is (5–90%):(10–90%):(0–50%):(50–120%). The present invention also relates to a method of preparing the above polymer.

Furthermore, the present invention relates to a photoresist solution comprising a polymer of Formula 2, a photo acid generator, and an organic solvent.

The present invention also relates to a semiconductor device manufactured by using the above photoresist solution, and a method of forming an ArF or a KrF photoresist pattern in the manufacture of such a semiconductor device.

DETAILED DESCRIPTION

Figure 1:
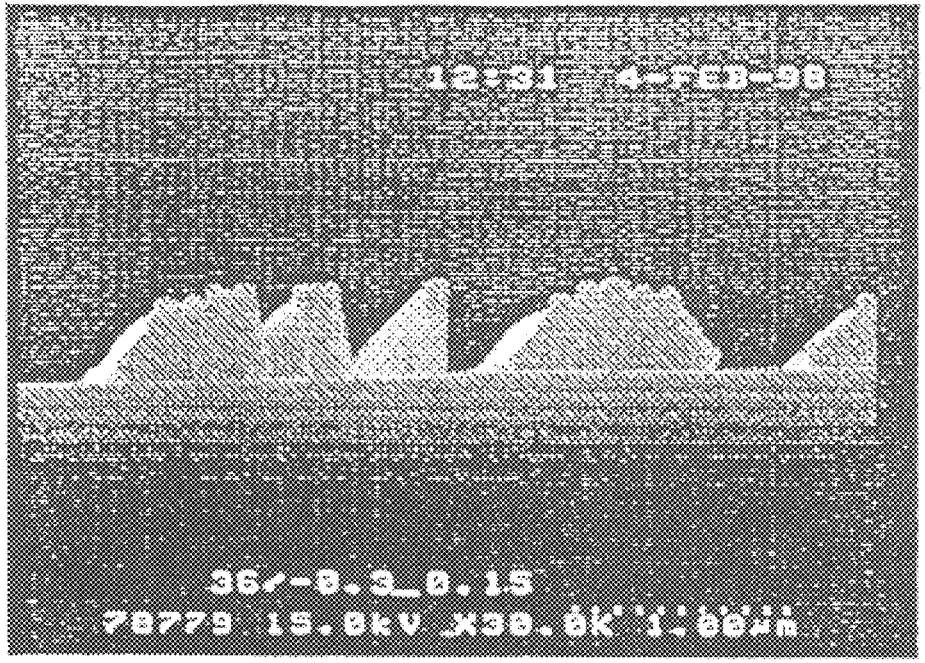
FIG. 1 is a photograph showing a micro pattern using a conventional ArF photoresist resin.

As briefly mentioned above, the present invention relates to an oxabicyclo compound represented by the following Formula 1:

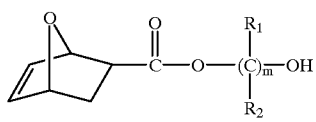

(1)

wherein, $R_1$ and $R_2$ are the same or different, and represent hydrogen or a $C_1$–$C_4$ straight or branched chain substituted alkyl group; and m is a number from 1 to 4; and a method for preparing the same As further stated, the present invention also relates to a polymer represented by the following Formula 2, in which an oxabicyclo compound of the above Formula 1 is used as a monomer:

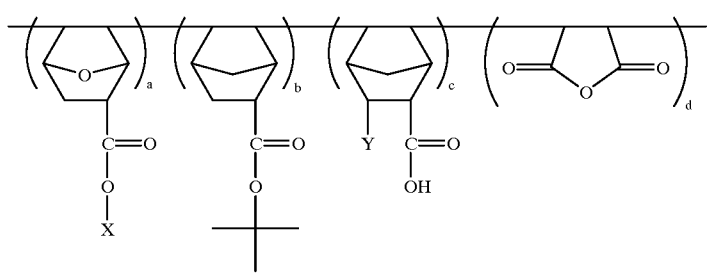

(2)

wherein, X is 2-hydroxy ethyl, 2-hydroxy propyl, 3-hydroxy propyl, 2-hydroxy butyl, 3-hydroxy butyl, 4-hydroxy butyl, or 2-methyl-3-hydroxy propyl; Y is a hydrogen or a carboxylic acid group; and the ratio a:b:c:d is (5–90%):(10–90%):(0–50%):(50–120%); and a method of preparing the same.

The present invention is explained more specifically in the following detailed description.

In one embodiment of the present invention, the oxabicyclo compound of Formula 1 may be 2-hydroxy ethyl oxabicyclo[2,2,1]hept-5-ene-2-carboxylate; 3-hydroxy propyl oxabicyclo[2,2,1]hept-5-ene-2-carboxylate; 2-hydroxy propyl oxabicyclo[2,2,1]hept-5-ene-2-carboxylate; 4-hydroxy butyl oxabicyclo[2,2,1]hept-5-ene-2-carboxylate; 3-hydroxy butyl oxabicyclo[2,2,1]hept-5-ene-2-carboxylate; 2-hydroxy butyl oxabicyclo[2,2,1]hept-5-ene-2-carboxylate; or 2-methyl-3-hydroxy propyl oxabicyclo[2,2,1]hept-5-ene-2-carboxylate.

According to the present invention, the oxabicyclo compound of Formula 1 may be prepared by reacting furan with an hydroxy acrylate in the presence of an organic solvent. Examples of hydroxy acrylates used in the present invention include 2-hydroxy ethyl acrylate, 3-hydroxy propyl acrylate, 2-hydroxy propyl acrylate, 4-hydroxy butyl acrylate, 3-hydroxy butyl acrylate, 2-hydroxy butyl acrylate, 2-methyl-3-hydroxy propyl acrylate, and the like. The hydroxy alkyl acrylate is used in a mole ratio of 1:1.5 on the basis of the furan used. The organic solvent may be toluene, tetrahydrofuran, ethyl ether, benzene, dichloromethane, chloroform, and the like. The organic solvent has a weight ratio of 200 to 800 on the basis of the compound represented by Formula 1.

According to one embodiment of the present invention, polymers represented by Formula 2 above may be prepared by reacting, in the presence of a polymerization initiator, (i) an oxabicyclo compound of Formula 1 above; and (ii) maleic anhydride, represented by the following Formula 6:

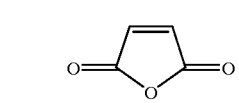

(6)

In another embodiment, the two monomers of (i) and (ii) above may react, in the presence of a polymerization initiator, with one or more of the compounds selected for the group consisting of (iii) t-butyl-5-norbornene-2-carboxylate, represented by the following Formula 3;

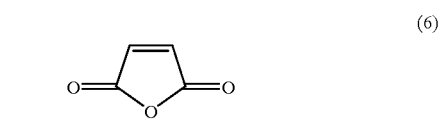

(3)

and (iv) compounds represented by the following Formula 5a:

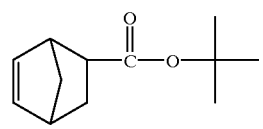

(5a)

wherein Y is hydrogen or a carboxylic acid group. Examples of compounds of Formula 5a are 5-norbornene-2-carboxylic acid, represented by the following Formula 4, and 5-norbornene-2,3-dicarboxylic acid, represented by the following Formula 5.

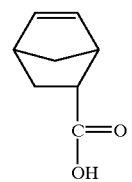

(4)

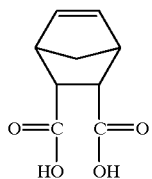

(5)

Examples of polymers according to the present invention include:

poly(2-hydroxyethyl oxabicyclo[2,2,1]hept-5-ene-2-carboxylate/t-butyl 5-norbornene-2-carboxylate/5-norbornene-2-carboxylic acid/maleic anhydride) polymer;

poly(3-hydroxypropyl oxabicyclo[2,2,1]hept-5-ene-2-carboxylate/t-butyl 5-norbornene-2-carboxylate/5-norbornene-2-carboxylic acid/maleic anhydride) polymer;

poly(2-hydroxypropyl oxabicyclo[2,2,1]hept-5-ene-2-carboxylate/t-butyl 5-norbornene-2-carboxylate/5-norbornene-2-carboxylic acid/maleic anhydride) polymer;

poly(4-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(3-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(2-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(2-methyl-3-hydroxypropyl oxabicyclo[2,2,1]hept-5-ene-2-carboxylate/t-butyl 5-norbornene-2-carboxylate/5-norbornene-2-carboxylic acid/maleic anhydride) polymer;

poly(2-hydroxyethyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(3-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(4-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(3-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-methyl-3-hydroxypropyl oxabicyclo[2,2,1]hept-5-ene-2-carboxylate/t-butyl 5-norbornenc-2-carboxylate/5-norbornene-2,3-dicarboxylic acid/maleic anhydride) polymer;

poly(2-hydroxyethyl oxabicyclo[2,2,1]hept-5-ene-2-carboxylate/t-butyl 5-norbornene-2-carboxylate/maleic anhydride) polymer;

poly(3-hydroxypropyl oxabicyclo[2,2,1]hept-5-ene-2-carboxylate/t-butyl 5-norbornene-2-carboxylatc/maleic anhydride) polymer;

poly(2-hydroxypropyl oxabicyclo[2,2,1]hept-5-ene-2-carboxylate/t-butyl 5-norbornene-2-carboxylate/maleic anhydride) polymer;

poly(2-hydroxypropyl oxabicyclo[2,2,1]hept-5-ene-2-carboxylate/t-butyl 5-norbornene-2-carboxylatc/maleic anhydride) polymer;

poly(4-hydroxybutyl oxabicyclo[2,2,1]hept-5-ene-2-carboxylate/t-butyl 5-norbornene-2-carboxylate/maleic anhydride) polymer;

poly(3-hydroxybutyl oxabicyclo[2,2,1]hept-5-ene-2-carboxylate/t-butyl 5-norbornene-2-carboxylate/maleic anhydride) polymer;

poly(3-hydroxybutyl oxabicyclo[2,2,1]hept-5-ene-2-carboxylate/t-butyl 5-norbornene-2-carboxylate/maleic anhydride) polymer;

poly(2-hydroxybutyl oxabicyclo[2,2,1]hept-5-ene-2-carboxylate/t-butyl 5-norbornene-2-carboxylate/maleic anhydride) polymer; and poly(2-methyl-3-hydroxypropyl oxabicyclo[2,2,1]hept-5-ene-2-carboxylate/t-butyl 5-norbornene-2-carboxylate/maleic anhydride) polymer.

The polymers of the present invention can be prepared by a conventional polymerization process such as bulk polymerization or solution polymerization. As a specific example, one or more of t-butyl 5-norborncne-2-carboxylate, 5-norbornene-2-carboxylic acid, and 5-norbornene-2,3-dicarboxylic acid may be dissolved in an organic polymerization solvent with an oxabicyclo compound of the present invention and maleic anhydride. The polymerization initiator is added thereto, and the resultant solution is reacted at a temperature between 60° C. to 90° C., in a nitrogen or an argon atmosphere, for 4 to 20 hours. After the polymerization reaction is complete, the polymer is precipitated in an ethyl ether solvent, then dried in a vacuum to obtain the pure polymer. Typical solvents used in the polymerization process include tetrahydrofuran, toluene, benzene, methyl ethyl ketone, dioxane, and the like. Typical polymerization initiators include 2,2-azobisisobutyronitrile (AIBN), acetyl peroxide, lauryl peroxide, t-butyl peroxide, di-t-butyl peroxide, and the like.

According to the present invention, a photoresist solution may be prepared by mixing a polymer of Formula 2, a photo acid generator, and an organic solvent. In the method of forming a photoresist pattern on a semiconductor device, the amount of the photoresist polymer resin used varies with the organic solvent, the photo acid generator, and the conditions of the lithography process, but the photoresist resin is generally used in an amount equal to about 10 to 30 wt % of the organic solvent used in the photoresist solution.

In the practice of the present invention, the photo acid generator comprises sulfur salts or onium salts, for example, triphenylsulfonium triflate, dibutylnaphthyl sulfonium triflate, 2,6-dimethyl sulfonate, bis(arylsulforyl)-diazomethane, oximsulfonate, 1,2-diazonaphtoqinone-4-sulfonate, and the like. The photo acid generator used is approximately 0.05 to 10 wt % of the photoresist polymer used in the photoresist solution. The photo sensitivity is insufficient at amounts of photo acid generator below 0.05 wt %. Because the photo acid generator absorbs too much of the ultra-violet rays, patterns having poor profiles are formed at over 20 wt %.

The organic solvent used may be ethyl 3-ethoxypropionate, methyl 3-methoxypropionate, cyclohexanone, propylenglycol, methyl ether acetate, and the like. To obtain a photoresist layer having a desirable thickness, the solvent is preferably 200 to 1000 wt % of the photoresist resin. For example, it has been found that a satisfactory photoresist layer having a thickness of 0.5 μm can be formed when the solvent used is 600 wt % of the photoresist resin.

The photoresist solution of the present invention may be used in the conventional manner, i.e., it may be spin-coated on a silicon wafer, baked, then exposed to a laser exposer and once more baked, and then developed in the tetramethyl ammonium hydroxide solution. As a result, the desired photoresist micro pattern is formed on the wafer. Suitable light sources used for exposing the wafer include ArF, KrF, EUV(extreme ultraviolet), an electron beam, an ion beam, and the like. Accordingly, the photoresist resins containing the oxabicyclo monomers of the present invention may be used in the ultra-violet regions of the light spectrum.

A better understanding of the present invention may be obtained from the following examples which are set forth to illustrate, but to limit, the present invention.

PREPARATION EXAMPLE 1

Synthesis of 2-hydroxy ethyl oxabicyclo[2,2,1]hept-5-ene-2-carboxylate (Formula 7)

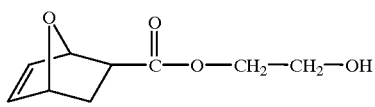

(7)

In a reactor, furan (1 mol) was dissolved in a tetrahydrofuran solvent (500 g), and the solution was cooled to a temperature of −30° C. Thereto, 2-hydroxyethyl acrylate(1 mol) was slowly added while the temperature of the solution remained at −30° C. The resultant solution was reacted for 10 hours while stirring at a temperature of −30° C. After the reaction was completed, the solution was reacted for 10 more hours while the temperature of the solution gradually ascended to 70° C. After the reaction was completed, the solvent was removed by a rotary evaporator, and the resultant was distilled at a reduced pressure. The pure 2-hydroxy ethyl oxabicyclo[2,2,1]hept-5-ene-2-carboxylate (147 g) was obtained. (yield: 80%, purity: 99.9%).

PREPARATION EXAMPLE 2

Synthesis of 3-hydroxypropyl oxabicyclo[2,2,1]hept-5-ene-2-carboxylate (Formula 8)

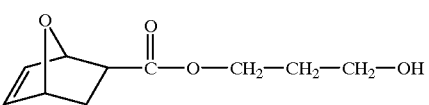

(8)

The same procedure described in Preparation Example 1 was repeated, but 3-hydroxypropyl acrylate (1 mol) was used instead of 2-hydroxyethyl acrylate to obtain 3-hydroxypropyl oxabicyclo[2,2,1]hept-5-ene-2-carboxylate (154 g). (yield: 78%, purity: 99%).

PREPARATION EXAMPLE 3

Synthesis of 2-hydroxypropyl oxabicyclo[2,2,1]hept-5-ene-2-carboxylate (Formula 9)

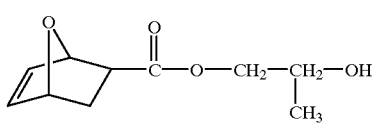

(9)

The same procedure described in Preparation Example 1 was repeated but 2-hydroxypropyl acrylate (1 mol) was used instead of 2-hydroxyethyl acrylate to obtain 2-hydroxypropyl oxabicyclo[2,2,1]hept-5-ene-2-carboxylate (139 g). (yield: 70%, purity: 99.9%).

PREPARATION EXAMPLE 4

Synthesis of 4-hydroxybutyl oxabicyclo[2,2,1]hept-5-ene-2-carboxylate (Formula 10)

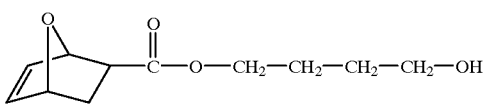

(10)

The same procedure described in Preparation Example 1 was repeated but 4-hydroxybutyl acrylate (1 mol) was used instead of 2-hydroxyethyl acrylate to obtain 4-hydroxybutyl oxabicyclo[2,2,1]hept-5-ene-2-carboxylate (170 g). (yield: 80%, purity: 99%).

PREPARATION EXAMPLE 5

Synthesis of 3-hydroxybutyl oxabicyclo[2,2,1]hept-5-ene-2-carboxylate (Formula 11)

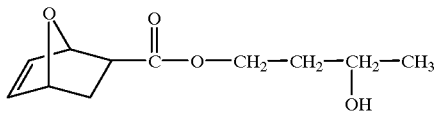

(11)

The same procedure described in Preparation Example 1 was repeated but 3-hydroxybutyl acrylate (1 mol) was used instead of 2-hydroxyethyl acrylate to obtain 3-hydroxybutyl oxabicyclo[2,2,1]hept-5-ene-2-carboxylate (166 g). (yield: 78%, purity: 99.1%).

PREPARATION EXAMPLE 6

Synthesis of 2-hydroxybutyl oxabicyclo[2,2,1]hept-5-ene-2-carboxylate (Formula 12)

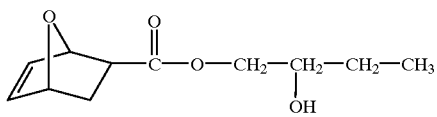

(12)

The same procedure described in Preparation Example 1 was repeated but 2-hydroxybutyl acrylate (1 mol) was used instead of 2-hydroxyethyl acrylate to obtain 2-hydroxybutyl oxabicyclo[2,2,1]hept-5-ene-2-carboxylate (153 g). (yield: 72%, purity: 98.9%).

PREPARATION EXAMPLE 7

Synthesis of 2-methyl-3-hydroxypropyl oxabicyclo[2,2,1]hept-5-ene-2-carboxylate (Formula 13)

(13)

The same procedure described in Preparation Example 1 was repeated but 2-methyl-3-hydroxypropyl acrylate (1 mol) was used instead of 2-hydroxyethyl acrylate to obtain 2-methyl-3-hydroxypropyl oxabicyclo[2,2,1]hept-5-ene-2-carboxylate (149 g). (yield: 70%, purity: 98%).

PREPARATION EXAMPLE 8

Synthesis of poly(2-hydroxyethyl oxabicyclo[2,2,1]hept-5-ene-2-carboxylate/t-butyl 5-norbornene-2-carboxylate/5-norbornene-2-carboxylic acid/maleic anhydride)polymer (Formula 14)

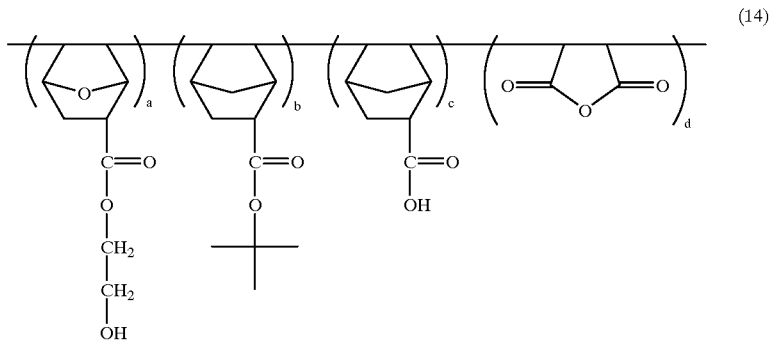

(14)

2-hydroxyethyl oxabicyclo[2,2,1]hept-5-ene-2-carboxylate (0.1 mol), t-butyl 5-norbornene-2-carboxylate (0.85 mol), 5-norbornene-2-carboxylic acid (0.05 mol) and maleic anhydride (1 mol) were dissolved in tetrahydrofuran solvent (200 g). Thereto, 2,2-azobisisobutyonitrile (5.84 g) was added, and the solution was mixed. The solution was polymerized at a temperature of 67° C. in a nitrogen atmosphere for 10 hours. After the polymerization reaction was completed, the polymer was precipitated in an ethyl ether solvent, then was dried in a vacuum to obtain the pure title polymer (89.4 g) having a molecular weight of approximately 6700. (yield: 31%, purity: 99.9%).

PREPARATION EXAMPLE 9

Synthesis of poly(3-hydroxypropyl oxabicyclo[2,2,1]hept-5-ene-2-carboxylate/t-butyl 5-norbornene-2-carboxylate/5-norbornene-2-carboxylic acid/maleic anhydride)polymer (Formula 15)

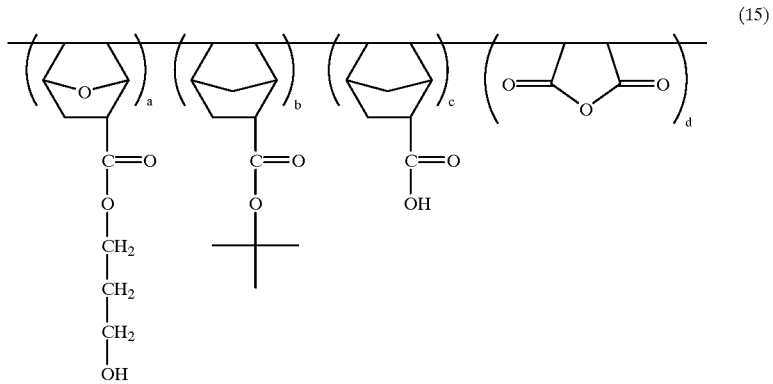

The same procedure described in Preparation Example 8 was repeated but 3-hydroxypropyl oxabicyclo[2,2,1]hept-5-ene-2-carboxylic acid (19.43 g) was used instead of 2-hydroxyethyl oxabicyclo[2,2,1]hept-5-ene-2-carboxylic acid to obtain the pure title polymer (91.32 g) having a molecular weight of approximately 7200. (yield: 31.5%, purity: 99.9%).

PREPARATION EXAMPLE 10

Synthesis of poly(2-hydroxypropyl oxabicyclo[2,2,1]hept-5-ene-2-carboxylate/t-butyl 5-norbornene-2-carboxylate/5-norbornene-2-carboxylic acid/maleic anhydride) polymer (Formula 16)

The same procedure described in Preparation Example 8 was repeated but 2-hydroxypropyl oxabicyclo[2,2,1]hept-5-ene-2-carboxylic acid (19.43 g) was used instead of 2-hydroxyethyl oxabicyclo[2,2,1]hept-5-ene-2-carboxylic acid to obtain the pure title polymer (86.68 g) having a molecular weight of approximately 6112. (yield: 29%, purity: 99.9%).

PREPARATION EXAMPLE 11

Synthesis of poly(4-hydroxybutyl oxabicyclo[2,2,1]hept-5-ene-2-carboxylate/t-butyl 5-norbornene-2-carboxylate/5-norbornene-2-carboxylic acid/maleic anhydride) polymer

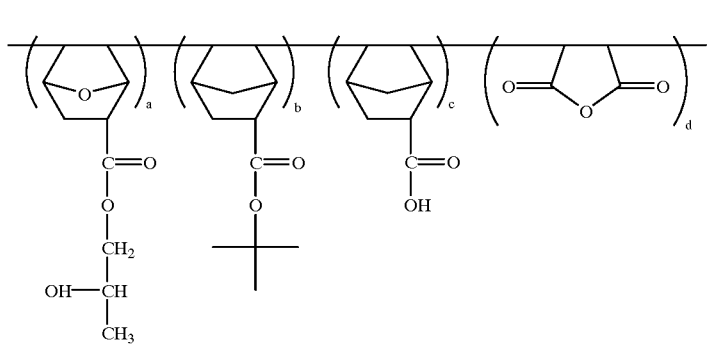

(Formula 17)

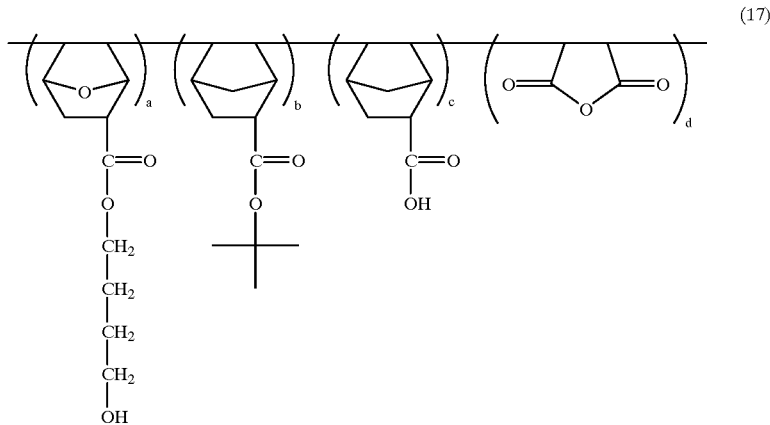

The same procedure described in Preparation Example 8 was repeated but 4-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (87.39 g) having a molecular weight of approximately 5700. (yield: 30%, purity: 99.9%).

PREPARATION EXAMPLE 12

Synthesis of poly(3-hydroxybutyl oxabicyclo[2,2,1]hept-5-ene-2-carboxylate/t-butyl 5-norbornene-2-carboxylate/5-norbornene-2-carboxylic acid/maleic anhydride) polymer (Formula 18)

The same procedure described in Preparation Example 8 was repeated but 3-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (87.3 g) having a molecular weight of approximately 5820. (yield: 30%, purity: 99.9%).

PREPARATION EXAMPLE 13

Synthesis of poly(2-hydroxybutyl oxabicyclo[2,2,1]hept-5-ene-2-carboxylate/t-butyl 5-norbornene-2-carboxylate/5-norbornene-2-carboxylic acid/maleic anhydride) polymer

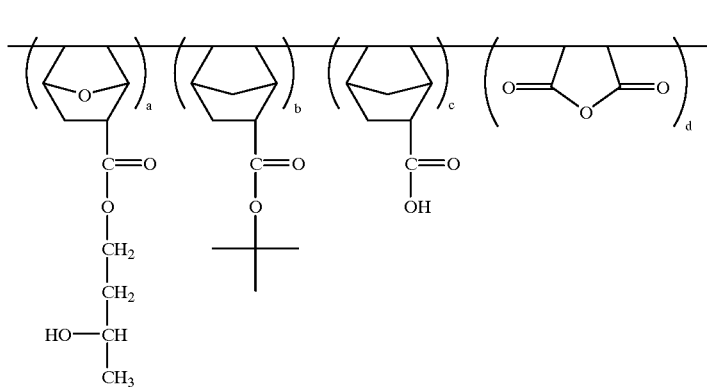

(Formula 19)

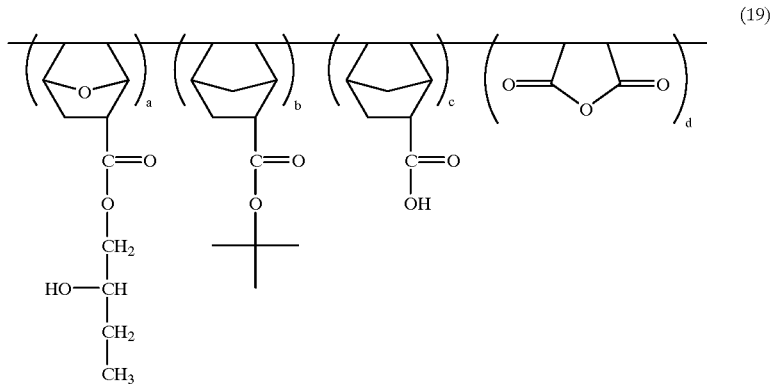

The same procedure described in Preparation Example 8 was repeated but 2-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (78.65 g) having a molecular weight of approximately 6110. (yield: 27%, purity: 99.9%).

PREPARATION EXAMPLE 14

Synthesis of poly(2-methyl-3-hydroxypropyl oxabicyclo[2,2,1]hept-5-ene-2-carboxylate/t-butyl 5-norbornene-2-carboxylate/5-norbornene-2-carboxylic acid/maleic anhydride) polymer (Formula 20)

The same procedure described in Preparation Example 8 was repeated but 2-methyl-3-hydroxypropyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (84.48 g) having a molecular weight of approximately 6320. (yield: 29%, purity: 99.9%).

PREPARATION EXAMPLE 15

Synthesis of poly(2-hydroxyethyl oxabicyclo[2,2,1]hept-5-ene-2-carboxylate/t-butyl 5-norbornene-2-carboxylate/5-norbornene-2,3-dicarboxylic acid/maleic anhydride)polymer

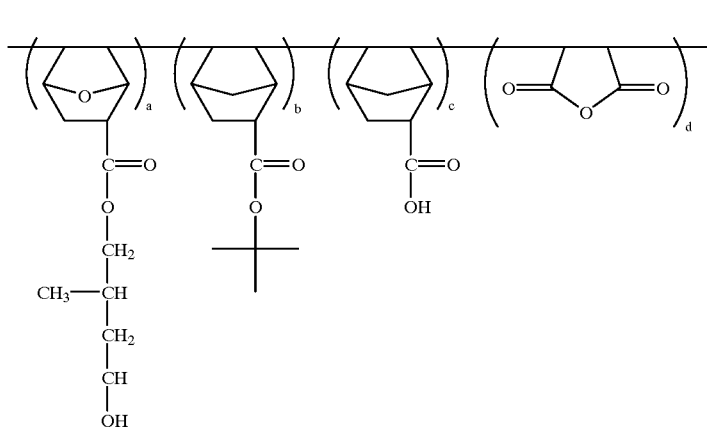

(Formula 21)

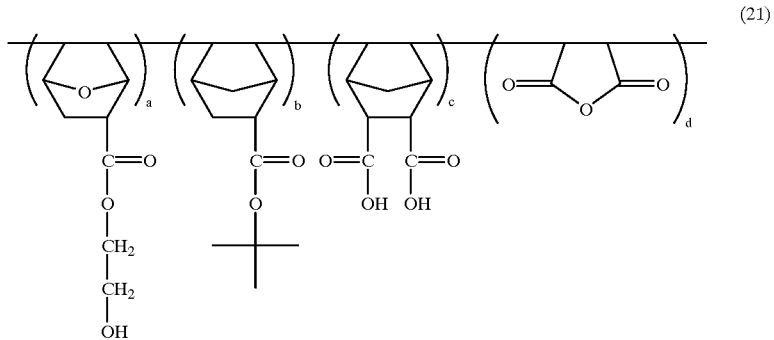

2-hydroxyethyl oxabicyclo[2,2,1]hept-5-ene-2-carboxylate (0.1 mol), t-butyl 5-norbornene-2-carboxylate (0.85 mol), 5-norbornene-2,3-dicarboxylic acid (0.05 mol) and maleic anhydride (1 mol) were dissolved in a tetrahydrofuran solvent (200 g). 2,2-azobisisobutyonitrile (5.84 g) was added, and the solution was mixed. The solution was polymerized at a temperature of 67° C. in a nitrogen atmosphere for 10 hours. After the polymerization reaction was completed, the polymer was precipitated in an ethyl ether solvent, then dried in a vacuum to obtain the pure title polymer (87.627 g). (yield: 30%, purity: 99.9%).

PREPARATION EXAMPLE 16

Synthesis of poly(3-hydroxypropyl oxabicyclo[2,2,1]hept-5-ene-2-carboxylate/t-butyl 5-norbornene-2-carboxylate/5-norbornene-2,3-dicarboxylic acid/maleic anhydride)polymer (Formula 22)

The same procedure described in Preparation Example 15 was repeated but 3-hydroxypropyl oxabicyclo[2,2,1]hept-5-ene-2-carboxylic acid (19.82 g) was used instead of 2-hydroxyethyl oxabicyclo[2,2,1]hept-5-ene-2-carboxylic acid to obtain the pure title polymer (92.1 g). (yield: 31.5%, purity: 99.9%).

PREPARATION EXAMPLE 17

Synthesis of poly(2-hydroxypropyl oxabicyclo[2,2,1]hept-5-ene-2-carboxylate/t-butyl 5-norbornene-2-carboxylate/5-norbornene-2,3-dicarboxylic acid/maleic anhydride)polymer

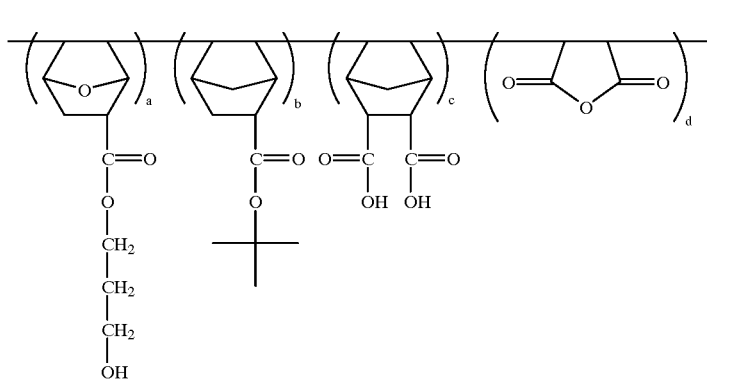

(Formula 23)

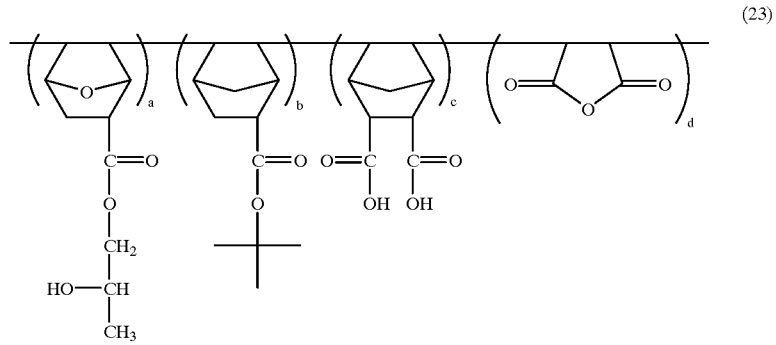

The same procedure described in Preparation Example 15 was repeated but 2-hydroxypropyl oxabicyclo[2,2,1]hept-5-ene-2-carboxylic acid (19.82 g) was used instead of 2-hydroxyethyl oxabicyclo[2,2,1]hept-5-ene-2-carboxylic acid to obtain the pure title polymer (92.08 g). (yield: 31.5%, purity: 99.9%).

PREPARATION EXAMPLE 18

Synthesis of poly(4-hydroxybutyl oxabicyclo[2,2,1] hept-5-ene-2-carboxylate/t-butyl 5-norbornene-2-carboxylate/5-norbornene-2,3-dicarboxylic acid/ maleic anhydride)polymer (Formula 24)

The same procedure described in Preparation Example 15 was repeated but 4-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (76.37 g). (yield: 26%, purity: 99.9%).

PREPARATION EXAMPLE 19

Synthesis of poly(3-hydroxybutyl oxabicyclo[2,2,1] hept-5-ene-2-carboxylatelt-butyl 5-norbornene-2-carboxylate/5-norbornene-2,3-dicarboxylic acid/ maleic anhydride)polymer

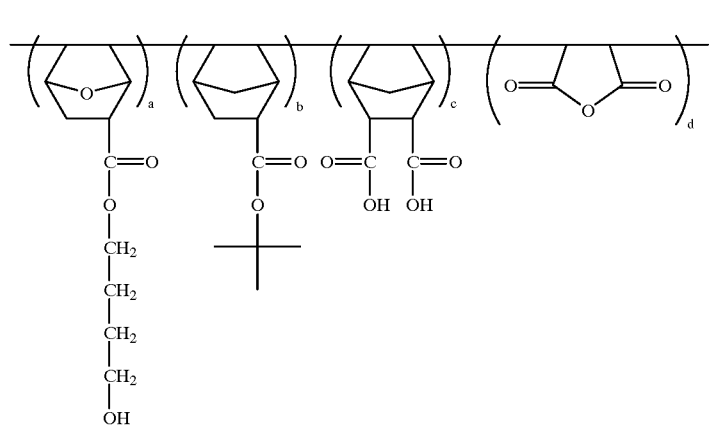

(Formula 25)

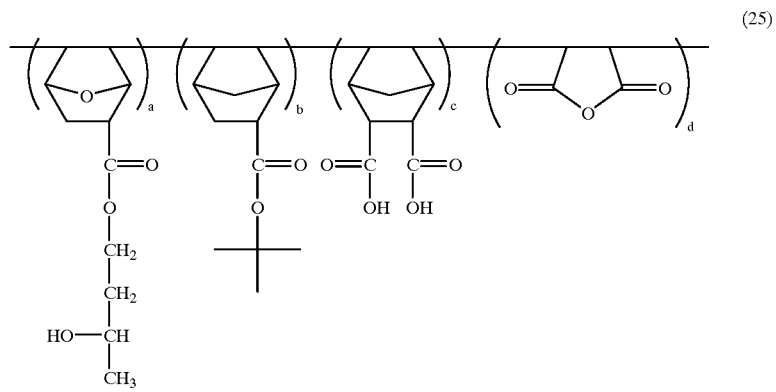

The same procedure described in Preparation Example 15 was repeated but 3-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (67.55 g). (yield: 23%, purity: 99.9%).

PREPARATION EXAMPLE 20

Synthesis of poly(2-hydroxybutyl oxabicyclo[2,2,1]hept-5-ene-2-carboxylate/t-butyl 5-norbornene-2-carboxylate/5-norbornene-2,3-dicarboxylic acid/maleic anhydride)polymer (Formula 26)

The same procedure described in Preparation Example 15 was repeated but 2-hydroxybutyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (73.43 g). (yield: 25%, purity: 99.9%).

PREPARATION EXAMPLE 21

Synthesis of poly(2-methyl-3-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer

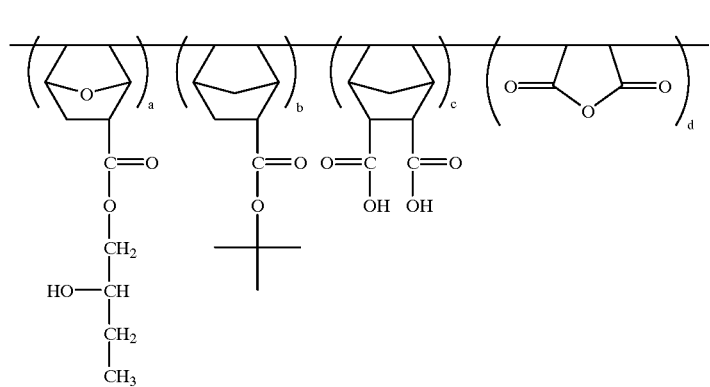

(Formula 27)

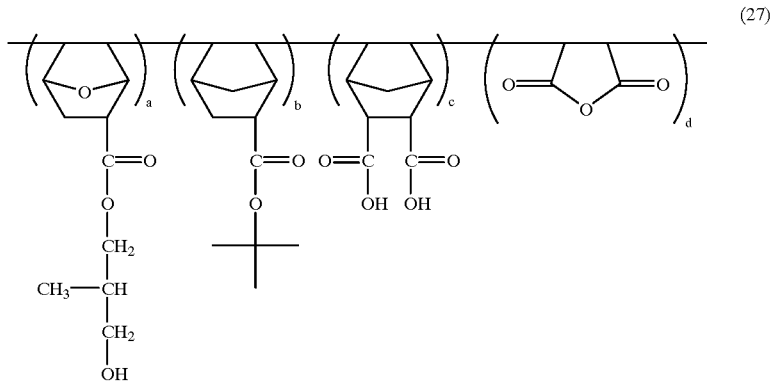

The same procedure described in Preparation Example 15 was repeated but 2-methyl-3-hydroxypropyl oxabicyclo[2,2,1]hept-5-ene-2-carboxylic acid (21.22 g) was used instead of 2-hydroxyethyl oxabicyclo[2,2,1]hept-5-ene-2-carboxylic acid to obtain the pure title polymer (88.11 g). (yield: 30%, purity: 99.9%).

PREPARATION EXAMPLE 22

Synthesis of poly(2-hydroxyethyl oxabicyclo[2,2,1]hept-5-ene-2-carboxylate/t-butyl 5-norbornene-2-carboxylate/maleic anhydride) polymer (Formula 28)

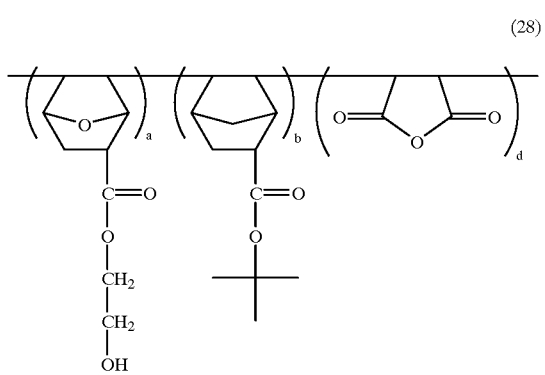

2-hydroxyethyl oxabicyclo[2,2,1]hept-5-ene-2-carboxylate (0.15 mol), t-butyl 5-norbornene-2-carboxylate (0.85 mol), and maleic anhydride (1 mol) were dissolved in a tetrahydrofuran solvent. 2,2-azobisisobutyonitrile (5.84 g) was added, and the solution was mixed. The solution was polymerized at a temperature of 67° C. in a nitrogen atmosphere for 10 hours. After the polymerization reaction was completed, the polymer was precipitated in an ethyl ether solvent, then dried in a vacuum to obtain the pure title polymer (63.94 g). (yield: 22%, purity: 99.9%).

PREPARATION EXAMPLE 23

Synthesis of poly(3-hydroxypropyl oxabicyclo[2,2,1]hept-5-ene-2-carboxylate/t-butyl 5-norbornene-2-carboxylate/maleic anhydride) polymer (Formula 29)

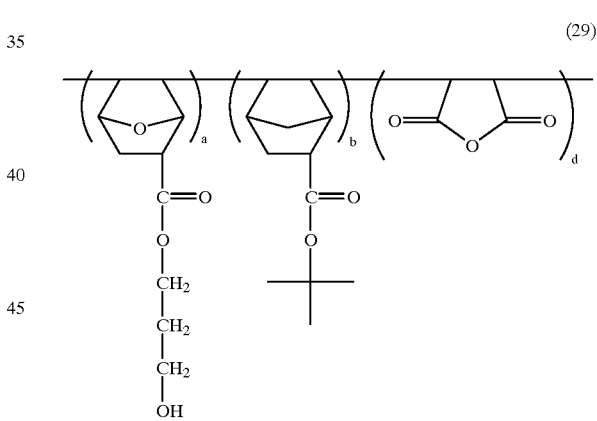

The same procedure described in Preparation Example 22 was repeated but 3-hydroxypropyl oxabicyclo[2,2,1]hept-5-ene-2-carboxylic acid (29.37 g) was used instead of 2-hydroxyethyl oxabicyclo[2,2,1]hept-5-ene-2-carboxylic acid to obtain the pure title polymer (73.18 g). (yield: 25%, purity: 99.9%).

PREPARATION EXAMPLE 24

Synthesis of poly(2-hydroxypropyl oxabicyclo[2,2,1]hept-5-ene-2-carboxylate/t-butyl 5-norbornene-2-carboxylate/maleic anhydride) polymer (Formula 30)

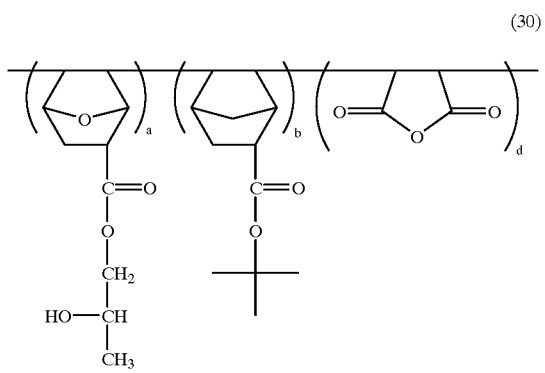

(30)

The same procedure described in Preparation Example 22 was repeated but 2-hydroxypropyl oxabicyclo[2,2,1]hept-5-ene-2-carboxylic acid (29.37 g) was used instead of 2-hydroxyethyl oxabicyclo[2,2,1]hept-5-ene-2-carboxylic acid to obtain the pure title polymer (76.1 g). (yield: 26%, purity: 99.9%).

PREPARATION EXAMPLE 25

Synthesis of poly(4-hydroxybutyl oxabicyclo[2,2,1]hept-5-ene-2-carboxylate/t-butyl 5-norbornene-2-carboxylate/maleic anhydride) polymer (Formula 31)

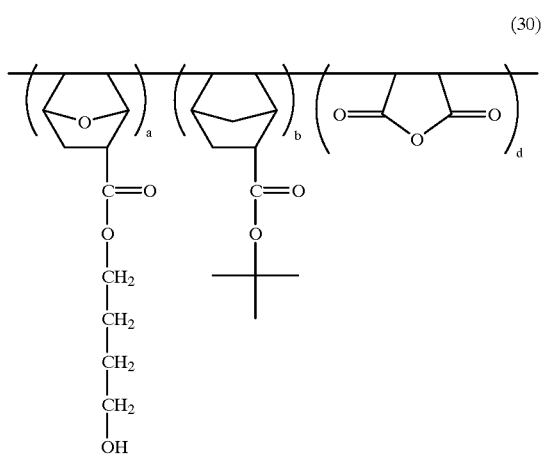

(30)

The same procedure described in Preparation Example 22 was repeated but 4-hydroxybutyl oxabicyclo[2,2,1]hept-5-ene-2-carboxylic acid (31.83 g) was used instead of 2-hydroxyethyl oxabicyclo[2,2,1]hept-5-ene-2-carboxylic acid to obtain the pure title polymer (67.82 g). (yield: 23%, purity: 99.9%).

PREPARATION EXAMPLE 26

Synthesis of poly(3-hydroxybutyl oxabicyclo[2,2,1]hept-5-ene-2-carboxylate/t-butyl 5-norbornene-2-carboxylate/maleic anhydride) polymer (Formula 32)

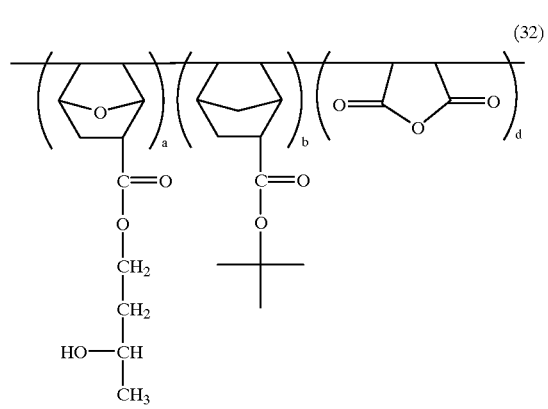

(32)

The same procedure described in Preparation Example 22 was repeated but 3-hydroxybutyl oxabicyclo[2,2,1]hept-5-ene-2-carboxylic acid (31.83 g) was used instead of 2-hydroxyethyl oxabicyclo[2,2,1]hept-5-ene-2-carboxylic acid to obtain the pure title polymer (67.82 g). (yield: 23%, purity: 99.9%).

PREPARATION EXAMPLE 27

Synthesis of poly(2-hydroxybutyl oxabicyclo[2,2,1]hept-5-ene-2-carboxylate/t-butyl 5-norbornene-2-carboxylate/maleic anhydride) polymer (Formula 33)

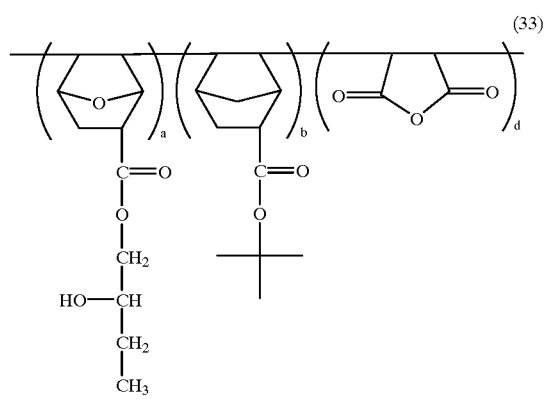

(33)

The same procedure described in Preparation Example 22 was repeated but 2-hydroxybutyl oxabicyclo[2,2,1]hept-5-ene-2-carboxylic acid (31.83 g) was used instead of 2-hydroxyethyl oxabicyclo[2,2,1]hept-5-ene-2-carboxylic acid to obtain the pure title polymer (70.7 g). (yield: 24%, purity: 99.9%).

PREPARATION EXAMPLE 28

Synthesis of poly(2-methyl-3-hydroxypropyl oxabicyclo[2,2,1]hept-5-ene-2-carboxylate/t-butyl 5-norbornene-2-carboxylate/maleic anhydride) polymer (Formula 34)

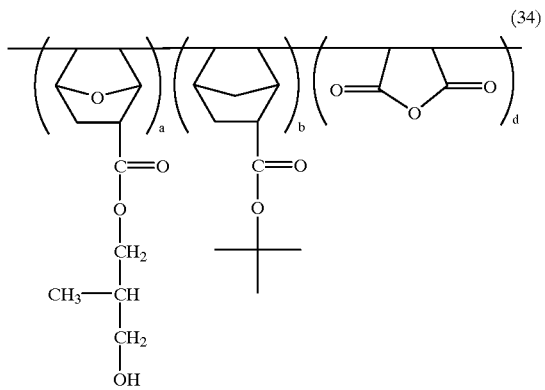

The same procedure described in Preparation Example 22 was repeated but 2-methyl-3-hydroxypropyl oxabicyclo[2,2,1]hept-5-ene-2-carboxylic acid (31.83 g) was used instead of 2-hydroxyethyl oxabicyclo[2,2,1]hept-5-ene-2-carboxylic acid to obtain the pure title polymer (61.92 g). (yield: 21%, purity: 99.9%).

EXAMPLE 1

Figure 2:
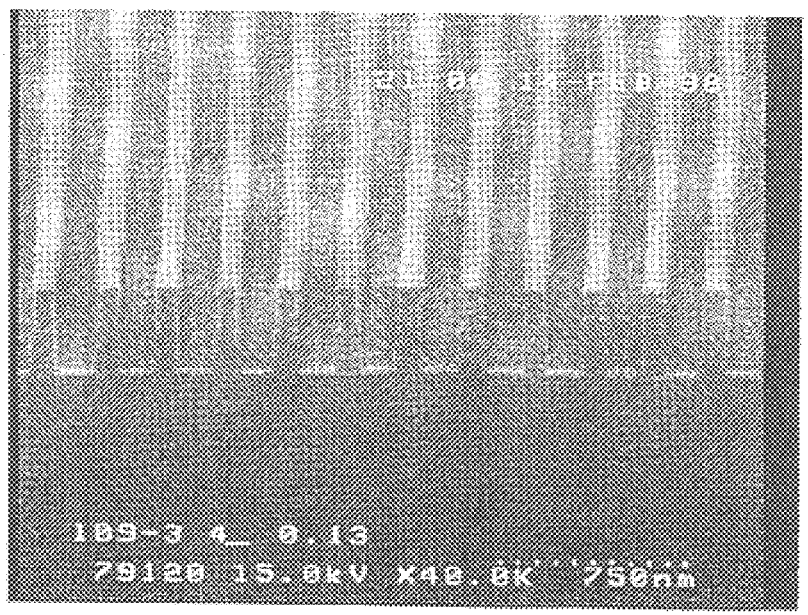
FIGS. 2 to 17 are photographs showing the micro patterns formed in Examples 1 to 16, respectively. The micro patterns were formed by using an ArF or a KrF photoresist resin containing an oxabicyclo monomer, according to the present invention.

The poly(2-hydroxyethyl oxabicyclo[2,2,1]hept-5-ene-2-carboxylate/t-butyl 5-norbornene-2-carboxylate/5-norbornene-2-carboxylic acid/maleic anhydride) polymer (10 g) obtained in Preparation Example 8 and triphenyl sulfonium triflate (0.12 g) were dissolved in ethyl 3-ethoxypropionate solvent (50 g), then filtered through a 0.10 μm filter to obtain a photoresist solution. The photoresist solution was spin-coated on a silicon wafer, and the wafer was baked at 110° C. for 90 seconds. Thereafter, the wafer was over-coated to prevent an amine contamination, and baked once more. After the baking process, the wafer was exposed to an ArF laser exposer, and then baked at 11° C. for 90 seconds. When the baking process was completed, the wafer was developed in 2.38 wt % tetramethylammonium hydroxide for 40 seconds. As a result, a pattern of 0.13 μm L/S was obtained (cf. FIG. 2). In addition to ArF, other exposing light sources can include KrF, an E-beam, EUV (extreme ultraviolet), an electron beam, an ion beam, and the like.

EXAMPLE 2

Figure 3:
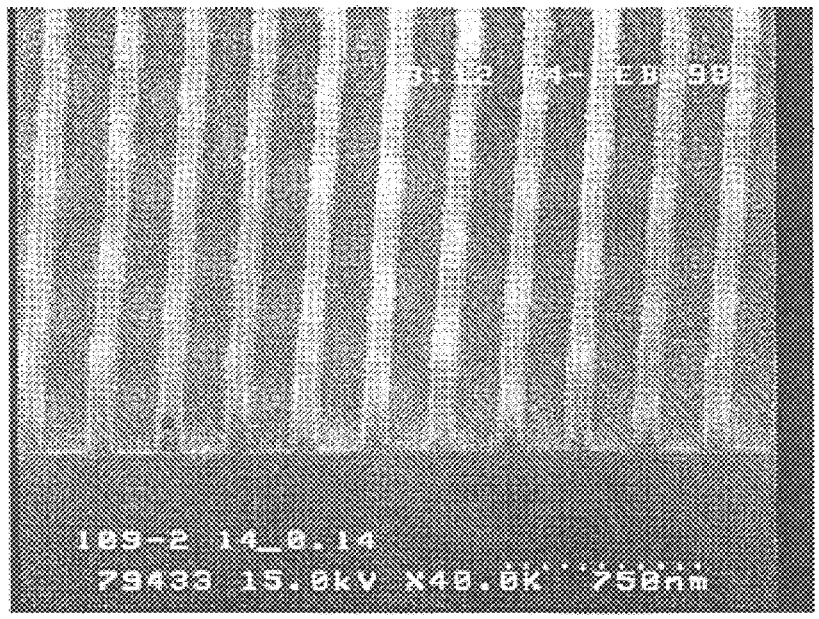

The same procedure described in Example 1 was repeated except using the poly(3-hydroxypropyl oxabicyclo[2,2,1]hept-5-ene-2-carboxylate/t-butyl 5-norbornene-2-carboxylate/5-norbornene-2-carboxylic acid/maleic anhydride) polymer (10 g) prepared in Preparation Example 9, to obtain a 0.14 μm L/S pattern (cf. FIG. 3).

EXAMPLE 3

Figure 4:
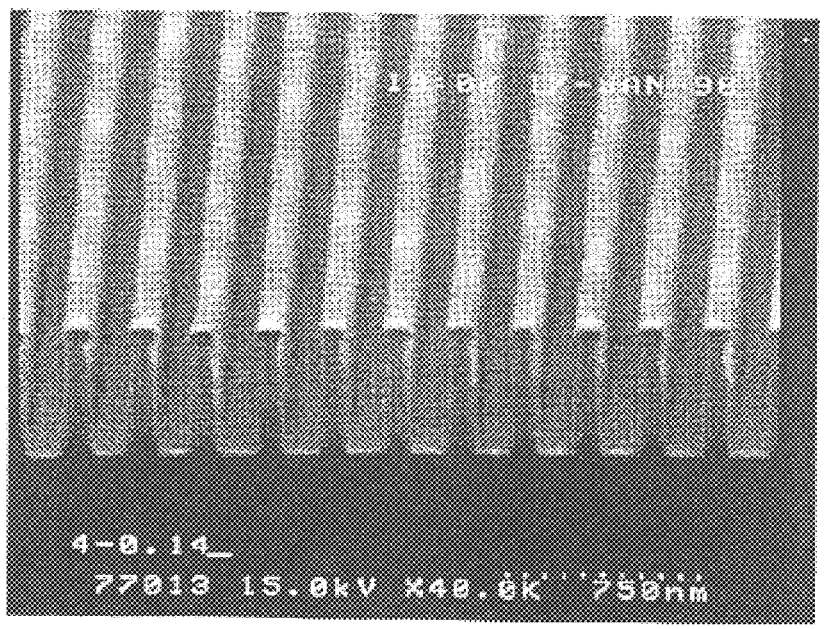

The same procedure described in Example 1 was repeated except using the poly(2-hydroxypropyl oxabicyclo[2,2,1]hept-5-ene-2-carboxylate/t-butyl 5-norbornene-2-carboxylate/5-norbornene-2-carboxylic acid/maleic anhydride) polymer (14 g) prepared in Preparation Example 10, to obtain a 0.14 μm L/S pattern (cf. FIG. 4).

EXAMPLE 4

Figure 5:
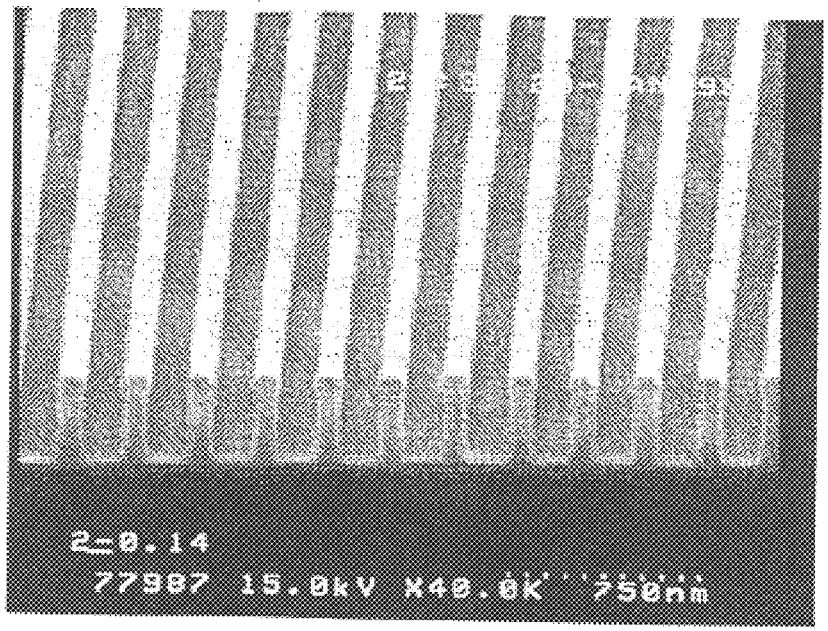

The same procedure described in Example 1 was repeated except using the poly(4-hydroxybutyl oxabicyclo[2,2,1]hept-5-ene-2-carboxylate/t-butyl 5-norbornene-2-carboxylate/5-norborene-2-carboxylic acid/maleic anhydride) polymer (9 g) prepared in Preparation Example 11, to obtain a 0.14 μm L/S pattern (cf. FIG. 5).

EXAMPLE 5

Figure 6:
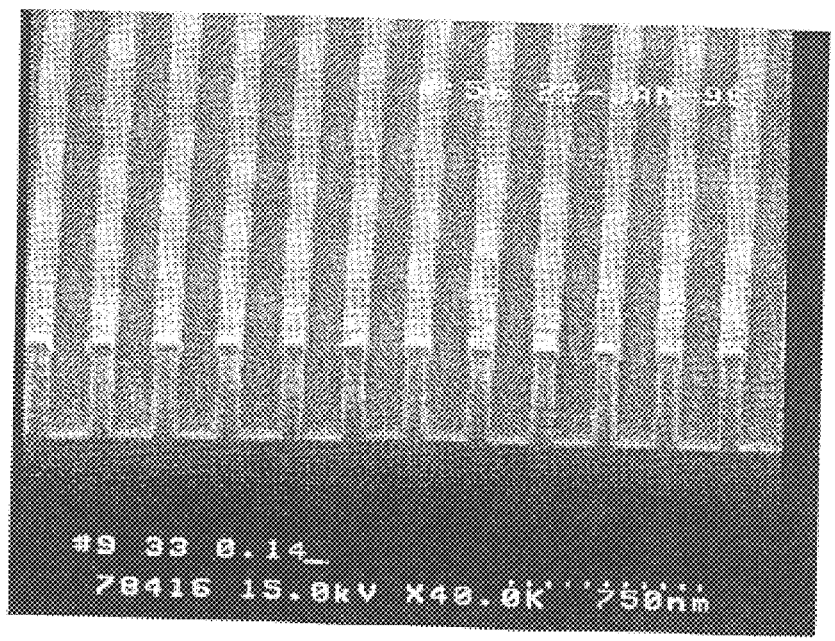

The same procedure described in Example 1 was repeated except using the poly(3-hydroxybutyl oxabicyclo[2,2,1]hept-5-ene-2-carboxylate/t-butyl 5-norbornene-2-carboxylate/5-norbornene-2-carboxylic acid/maleic anhydride) polymer (10 g) prepared in Preparation Example 12, to obtain a 0.14 μm L/S pattern (cf. FIG. 6).

EXAMPLE 6

Figure 7:
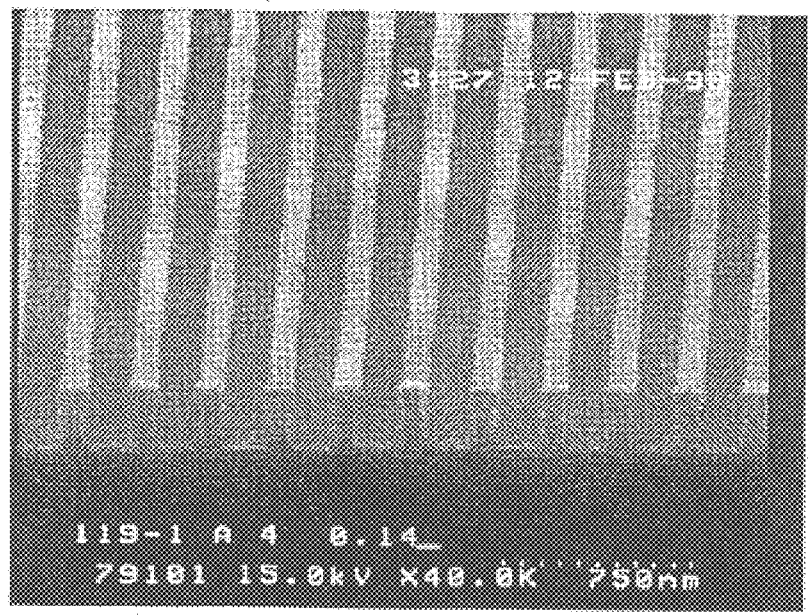

The same procedure described in Example 1 was repeated except using the poly(2-hydroxybutyl oxabicyclo[2,2,1]hept-5-ene-2-carboxylate/t-butyl 5-norbornene-2-carboxylate/5-norbornene-2-carboxylic acid/maleic anhydride) polymer (7 g) prepared in Preparation Example 13, to obtain a 0.14 μm L/S pattern (cf. FIG. 7).

EXAMPLE 7

Figure 8:
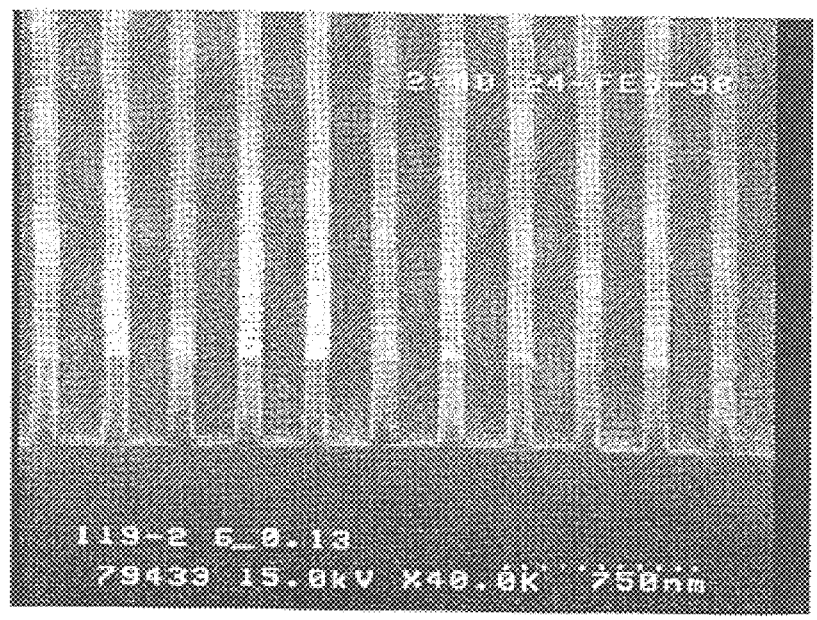

The same procedure described in Example 1 was repeated except using the poly(2-hydroxyethyl oxabicyclo[2,2,1]hept-5-ene-2-carboxylate/t-butyl 5-norbornene-2-carboxylate/5-norbornene-2,3-dicarboxylic acid/maleic anhydride) polymer (9 g) prepared in Preparation Example 15, to obtain a 0.13 μm L/S pattern (cf. FIG. 8).

EXAMPLE 8

Figure 9:
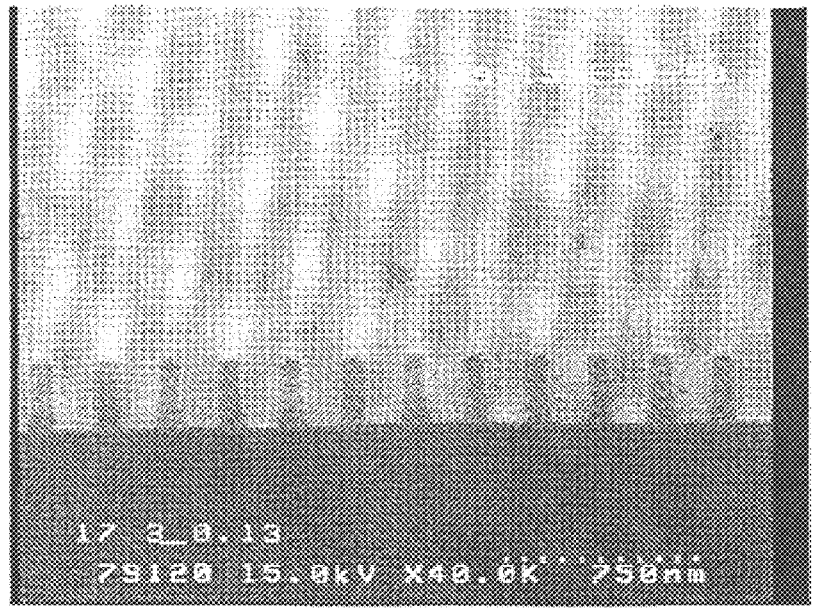

The same procedure described in Example 1 was repeated except using the poly(3-bydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer (8 g) prepared in Preparation Example 16, to obtain a 0.13 μm L/S pattern (cf. FIG. 9).

EXAMPLE 9

Figure 10:
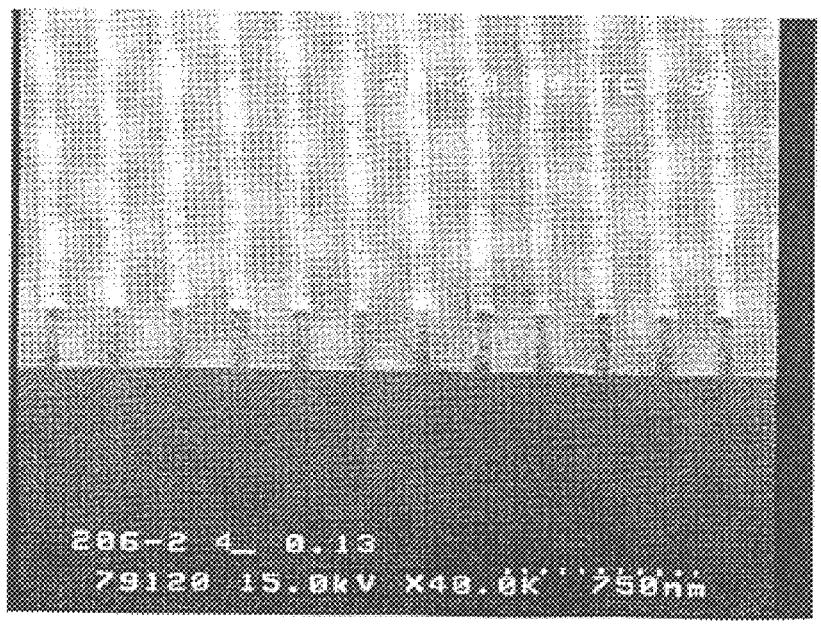

The same procedure described in Example 1 was repeated except using the poly(2-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer (8 g) prepared in Preparation Example 17, to obtain a 0.13 μm L/S pattern (cf. FIG. 10).

EXAMPLE 10

Figure 11:
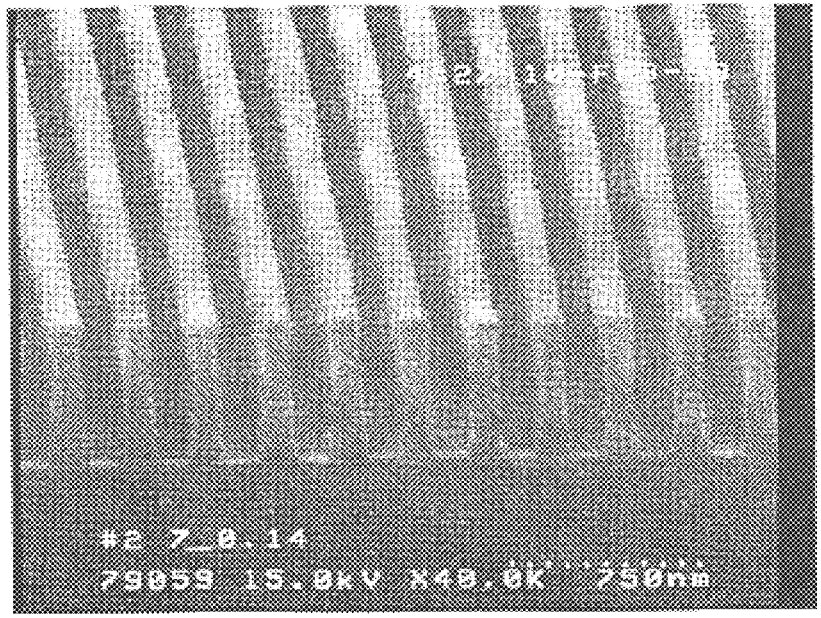

The same procedure described in Example 1 was repeated except using the poly(4-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer (12 g) prepared in Preparation Example 18, to obtain a 0.14μm L/S pattern (cf. FIG. 11).

EXAMPLE 11

Figure 12:
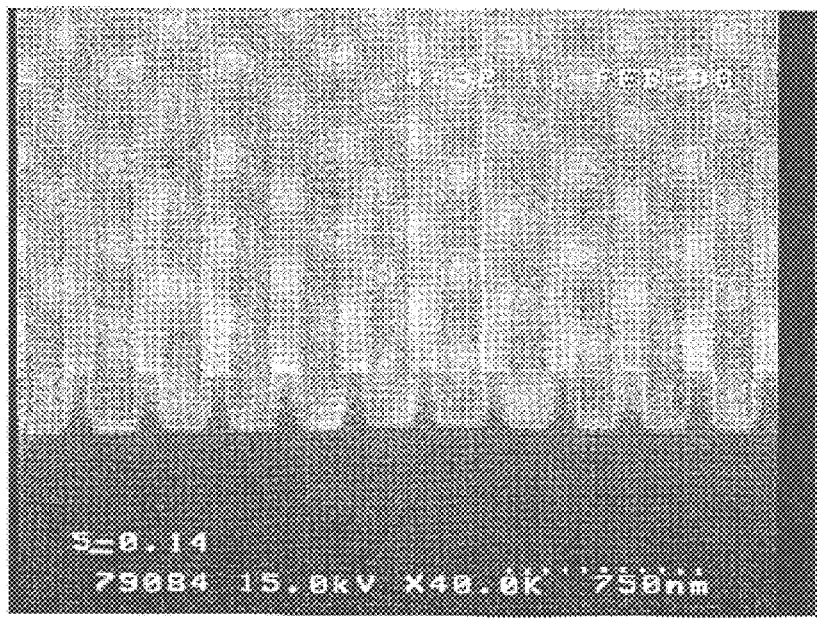

The same procedure described in Example 1 was repeated except using the poly(3-hydroxybutyl oxabicyclo[2,2,1]

hept-5-ene-2-carboxylate/t-butyl 5-norbornene-2-carboxylate/5-norbornene-2,3-dicarboxylic acid/maleic anhydride) polymer (8 g) prepared in Preparation Example 19, to obtain a 0.14 μm L/S pattern (cf. FIG. 12).

EXAMPLE 12

Figure 13:
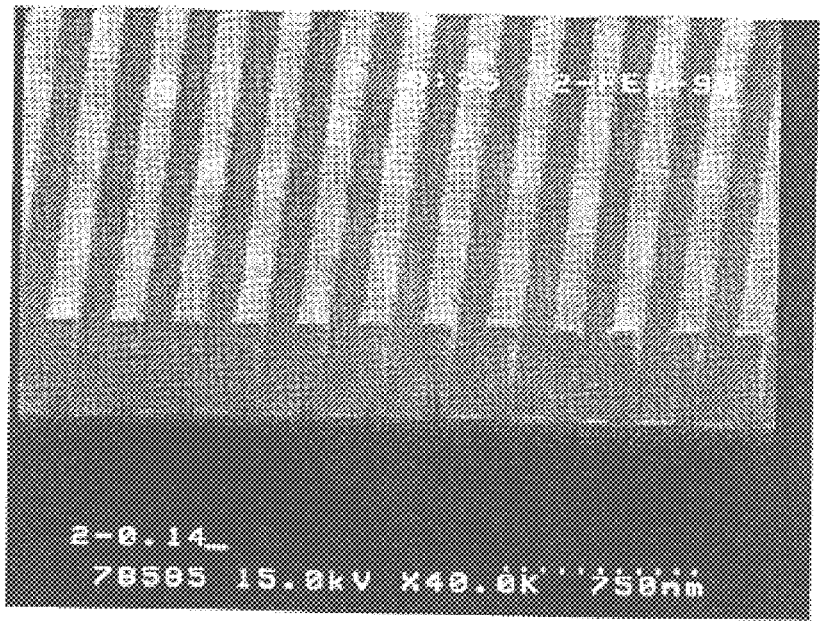

The same procedure described in Example 1 was repeated except using the poly(2-hydroxyethyl oxabicyclo[2,2,1] hept-5-ene-2-carboxylate/t-butyl 5-norbornene-2-carboxylate/maleic anhydride) polymer (10 g) prepared in Preparation Example 22, to obtain a 0.14μm L/S pattern (cf. FIG. 13).

EXAMPLE 13

Figure 14:
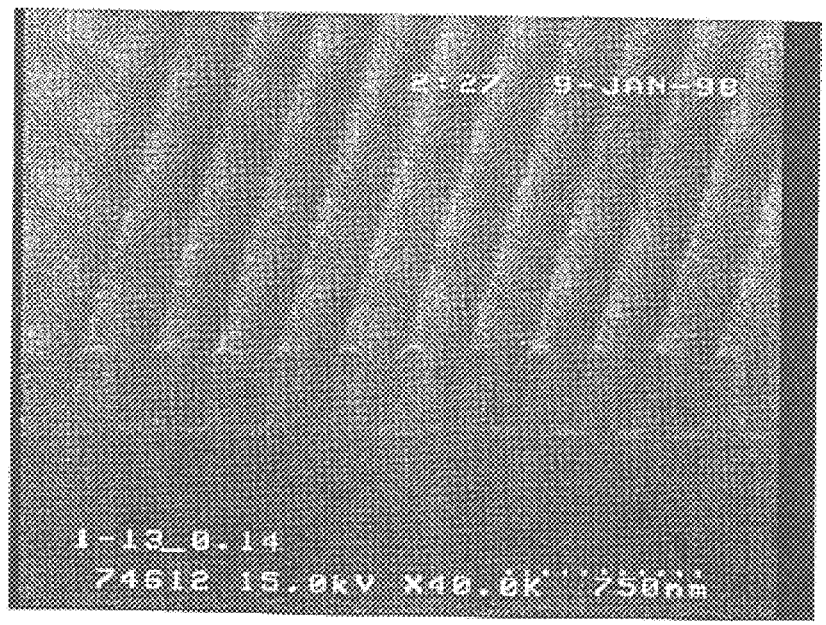

The same procedure described in Example 1 was repeated except using the poly(3-hydroxypropyl oxabicyclo[2,2,1] hept-5-ene-2-carboxylate/t-butyl 5-norbornene-2-carboxylate/maleic anhydride) polymer (9 g) prepared in Preparation Example 23, to obtain a 0.14 μm L/S pattern (cf. FIG. 14).

EXAMPLE 14

Figure 15:
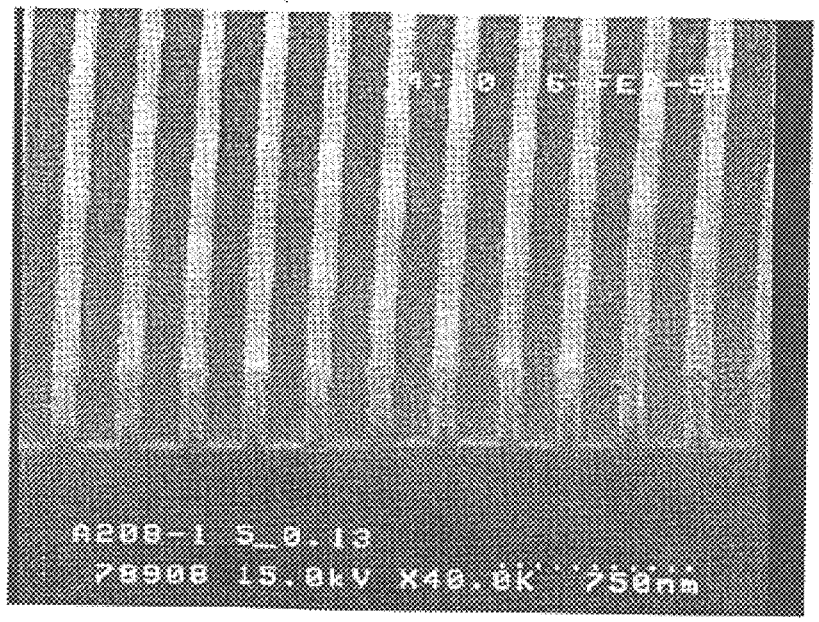

The same procedure described in Example 1 was repeated except using the poly(2-hydroxypropyl oxabicyclo[2,2,1] hept-5-ene-2-carboxylate/t-butyl 5-norbornene-2-carboxylate/maleic anhydride) polymer (9 g) prepared in Preparation Example 24, to obtain a 0.13 μm L/S pattern (cf. FIG. 15).

EXAMPLE 15

Figure 16:
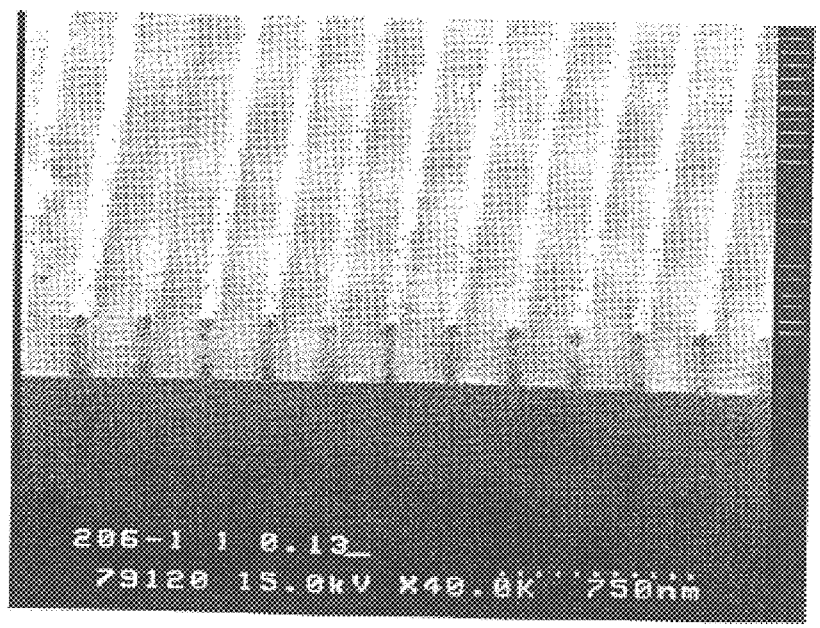

The same procedure described in Example 1 was repeated except using the poly(4-hydroxybutyl oxabicyclo[2,2,1] hept-5-ene-2-carboxylate/t-butyl 5-norbornene-2-carboxylate/maleic anhydride) polymer (8 g) prepared in Preparation Example 25, to obtain a 0.13 μm L/S pattern (cf. FIG. 16).

EXAMPLE 16

Figure 17:
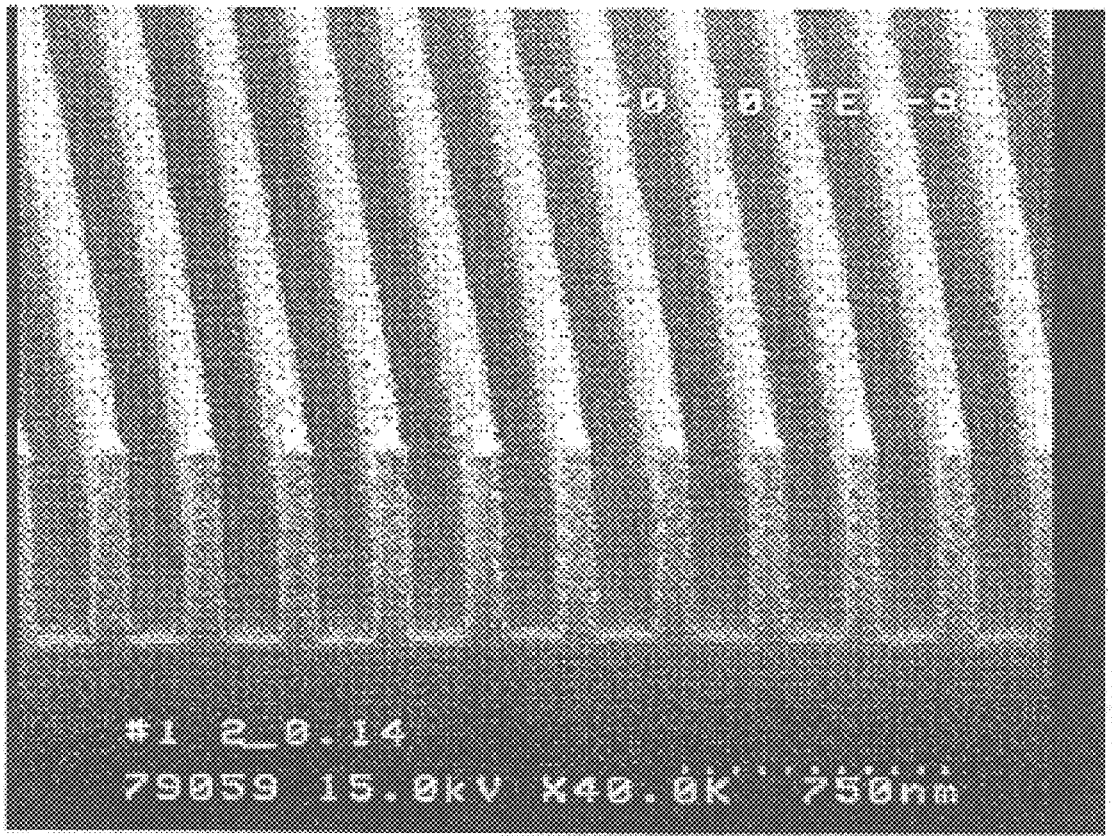

The same procedure described in Example 1 was repeated except using the poly(3-hydroxybutyl oxabicyclo[2,2,1] hept-5-ene-2-carboxylate/t-butyl 5-norbornene-2-carboxylate/maleic anhydride) polymer (13 g) prepared in Preparation Example 26, to obtain a 0.14 μm L/S pattern (cf. FIG. 17).

As described above, the oxabicyclo compounds of the present invention may be effectively used as monomers for manufacturing photoresist resins for ArF, KrF, EUV, an electron beam, or ion beam lithography processes, which can be used to produce a high density micro pattern of less than 0.15 μm(DRAM over 1 G). The photoresist resins containing the oxabicyclo monomer have good etching resistance, and do not allow a pattern collapse due to the high adhesiveness of the photoresist. Also, the oxabicyclo compounds have a high purity and low cost, and can therefore provide photoresist resins having such superior properties which can be mass-produced economically.

What is claimed is:

1. A photoresist copolymer comprising (i) the compound represented by the following Formula 1 as the first co-monomer, and (ii) maleic anhydride as the second co-monomer:

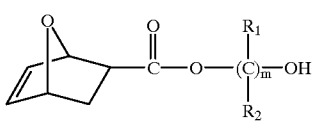

(1)

wherein, $R_1$ and $R_2$ are the same or different, and represent hydrogen or a $C_1$–$C_4$ straight or branched chain substituted alkyl group; and m is a number from 1 to 4.

2. A photoresist copolymer in accordance with claim 1, wherein the photoresist copolymer further comprises one or more of the compounds selected from the group consisting of t-butyl 5-norbornene-2-carboxylate and compounds represented by the following Formula 5a.

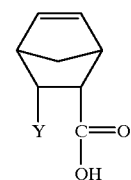

(5a)

wherein Y is hydrogen or a carboxylic acid group.

3. A photoresist copolymer in accordance with claim 1, wherein the photoresist copolymer is a compound represented by the following Formula 2:

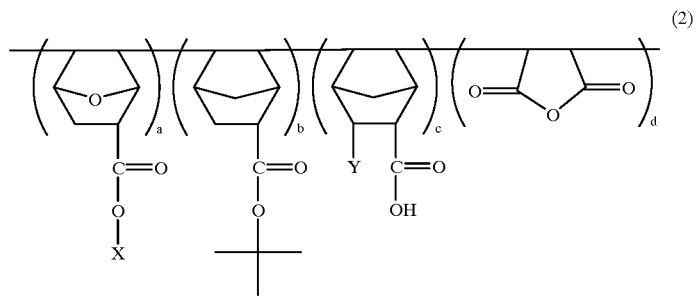

(2)

wherein, X is 2-hydroxyethyl, 2-hydroxypropyl, 3-hydroxypropyl, 2-hydroxybutyl, 3-hydroxybutyl, 2-methyl-3-hydroxypropyl or 4-hydroxybutyl;

Y is a hydrogen or a carboxylic acid group; and a, b, c and d are the respective polymerization ratios of co-monomers having a part in the copolymerization.

4. A photoresist copolymer in accordance with claim 3, wherein the ratio of a:b:c:d is (5–90 mole %):(10–90 mole %):(0 . 50 mole %):(50–120 mole %).

5. A photoresist copolymer in accordance with claim 3, wherein the compound represented by Formula 2 is selected from the group consisting of:

poly(2-hydroxyethyl oxabicyclo[2,2,1]hept-5-ene-2-carboxylate/t-butyl 5-norbornene-2-carboxylate/5-norbornene-2-carboxylic acid/maleic anhydride) polymer;

poly(3-hydroxypropyl oxabicyclo[2,2,1]hept-5-ene-2-carboxylate/t-butyl 5-norbornenc-2-carboxylate/5-norbornene-2-carboxylic acid/maleic anhydride) polymer;

poly(2-hydroxypropyl oxabicyclo[2,2,1]hept-5-ene-2-carboxylate/t-butyl 5-norbornene-2-carboxylate/5-norbornene-2-carboxylic acid/maleic anhydride) polymer;

poly(4-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(3-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(2-hydroxybutyl oxabicyclo[2,2,1]hept-5-ene-2-carboxylate/t-butyl 5-norbornene-2-carboxylate/5-norbornene-2-carboxylic acid/maleic anhydride) polymer;

poly(2-methyl-3-hydroxypropyl oxabicyclo[2,2,1]hept-5-ene-2-carboxylate/t-butyl 5-norbornene-2-carboxylate/5-norbornene-2-carboxylic acid/maleic anhydride) polymer;

poly(2-hydroxyethyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(3-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxypropyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(4-hydroxybutyl oxabicyclo[2,2,1]hept-5-ene-2-carboxylatc/t-butyl 5-norbornene-2-carboxylate/5-norbornene-2,3-dicarboxylic acid/maleic anhydride) polymer;

poly(3-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-hydroxybutyl oxabicyclo[2,2,1]hept-5-ene-2-carboxylate/t-butyl 5-norbornene-2-carboxylate/5-norbornene-2,3-dicarboxylic acid/maleic anhydride) polymer;

poly(2-methyl-3-hydroxypropyl oxabicyclo[2,2,1]hept-5-ene-2-carboxylate/t-butyl/5-norbornene-2,3-dicarboxylate/5-norbornene-2-carboxylic acid/maleic anhydride) polymer;

poly(2-hydroxyethyl oxabicyclo[2,2,1]hept-5-ene-2-carboxylate/t-butyl 5-orbomene-2-carboxylate/maleic anhydride) polymer;

poly(3-hydroxypropyl oxabicyclo[2,2,1]hept-5-ene-2-carboxylate/t-butyl 5-norbornene-2-carboxylate/maleic anhydride) polymer;

poly(2-hydroxypropyl oxabicyclo[2,2,1]hept-5-ene-2-carboxylate/t-butyl 5-norbornene-2-carboxylate/maleic anhydride) polymer;

poly(4-hydroxybutyl oxabicyclo[2,2,1]hept-5-ene-2-carboxylate/t-butyl 5-norbornene-2-carboxylate/maleic anhydride) polymer;

poly(3-hydroxybutyl oxabicyclo[2,2,1]hept-5-ene-2-carboxylate/t-butyl 5-norbornene-2-carboxylate/maleic anhydride) polymer;

poly(2-hydroxybutyl oxabicyclo[2,2,1]hept-5-ene-2-carboxylate/t-butyl 5-norbornene-2-carboxylate/maleic anhydride) polymer; and poly(2-methyl-3-hydroxypropyl oxabicyclo[2,2,1]hept-5-ene-2-carboxylate/t-butyl 5-norbornene-2,3-dicarboxylate/maleic anhydride) polymer.

6. A photoresist composition comprising (a) the photoresist copolymer of claim 1, (b) a photo acid generator; and (c) an organic solvent.

7. A photoresist composition in accordance with claim 6, wherein the amount of the photoresist copolymer is approximately 10 to 30 wt % of the organic solvent used.

8. A photoresist composition in accordance with claim 6, wherein the photo acid generator is a sulfur salt or an onium salt.

9. A photoresist composition in accordance with claim 6, wherein the photo acid generator is triphenylsulfonium triflate, dibuitylnaphtylsulfonium triflate, 2,6-dimethyl sulfonate, bis(arylsulfonyl)-diazomethane, oxime sulfonate, or 1,2-diazonaphthoquinone-4-sulfonate.

10. A photoresist composition in accordance with claim 6, wherein the amount of the photo acid generator is 0.05 to 10 wt % of the photoresist copolymer used.

11. A photoresist composition in accordance with claim 6, wherein the organic solvent is ethyl 3-ethoxy propionate, methyl 3-methoxy propionate, cyclohexanone, propylene glycol methyl ether acetate or a mixture thereof.

12. A method for forming a photoresist pattern, comprising the steps of:

(a) forming a photoresist film by coating the photoresist composition described in claim 6 on a silicon wafer;

(b) exposing the photoresist film to an exposer; and (c) developing the photoresist film.

13. A method for forming a photoresist pattern in accordance with claim 12, wherein the exposing light source of step (b) is ArF, KrF, EUV(extreme ultraviolet), an electron beam, an ion beam or an X-ray.

14. A method for forming a photoresist pattern in accordance with claim 12, wherein the photoresist film is baked before or after step(b).

15. A method for forming a photoresist pattern in accordance with claim 12, wherein step (c) is carried out by using tetramethylammonium hydroxide.

16. A semiconductor device manufactured by the method described in claim 12.

17. A method of preparing a photoresist copolymer of the following Formula 2:

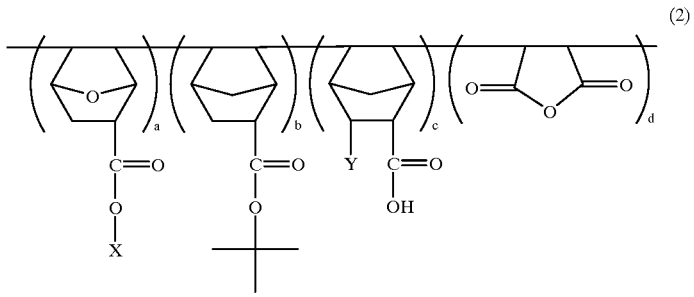

wherein, X is 2-hydroxyethyl, 2-hydroxypropyl, 3-hydroxypropyl, 2-hydroxybutyl, 3-hydroxybutyl, 2-methyl-3-hydroxypropyl or 4-hydroxybutyl; Y is a hydrogen or a carboxylic acid group; and a, b, c and d are the respective polymerization ratios of co-monomers having a part in the copolymerization; comprising the steps of:

(a) dissolving in a polymerization organic solvent (i) one or more compounds selected from the group consisting of t-butyl 5-norbornene-2-carboxylate; 5-norbornene-2-carboxylic acid and 5-norbornene-2,3-dicarboxylic acid; (ii) maleic anhydride; and (iii) the compound represented by the following Formula 1:

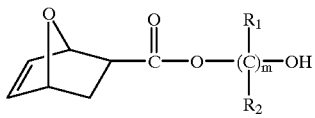

wherein, $R_1$ and $R_2$ are the same or different, and represent a hydrogen or a $C_1$–$C_4$ straight or branched chain substituted alkyl group; and m is a number from 1 to 4; and (b) adding a polymerization initiator to the resultant solution;

(c) precipitating the resultant solution using an ethyl ether solvent.

18. A method of preparing a photoresist copolymer in accordance with claim 17, wherein the polymerization initiator is 2,2-azobisisobutyronitrile, acetyl peroxide, lauryl peroxide, t-butyl peroxide, or di-t-butyl peroxide.

* * * * *